(12) United States Patent
Xie et al.

(10) Patent No.: US 12,136,655 B2
(45) Date of Patent: Nov. 5, 2024

(54) BACKSIDE ELECTRICAL CONTACTS TO BURIED POWER RAILS

(71) Applicant: International Business Machines Corporation, Armonk, NY (US)

(72) Inventors: Ruilong Xie, Niskayuna, NY (US); Brent Anderson, Jericho, VT (US); Albert M. Young, Fishkill, NY (US); Kangguo Cheng, Schenectady, NY (US); Julien Frougier, Albany, NY (US); Balasubramanian Pranatharthiharan, Watervliet, NY (US); Roy R. Yu, Poughkeepsie, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 17/481,706

(22) Filed: Sep. 22, 2021

(65) Prior Publication Data
US 2023/0093101 A1    Mar. 23, 2023

(51) Int. Cl.
| H01L 21/84 | (2006.01) |
| H01L 21/762 | (2006.01) |
| H01L 23/522 | (2006.01) |
| H01L 23/528 | (2006.01) |
| H01L 27/12 | (2006.01) |

(Continued)

(52) U.S. Cl.
CPC ...... *H01L 29/401* (2013.01); *H01L 21/76243* (2013.01); *H01L 21/84* (2013.01); *H01L 23/5226* (2013.01); *H01L 23/5286* (2013.01); *H01L 27/1203* (2013.01); *H01L 29/165* (2013.01); *H01L 29/41733* (2013.01); *H01L 29/41783* (2013.01); *H01L 29/42392* (2013.01); *H01L 29/66439* (2013.01); *H01L 29/66545* (2013.01); *H01L 29/66742* (2013.01); *H01L 29/78645* (2013.01)

(58) Field of Classification Search
CPC ............. H01L 29/401; H01L 29/66742; H01L 29/66007–66045
See application file for complete search history.

(56) References Cited

U.S. PATENT DOCUMENTS 9,219,129 B2  12/2015 Doris et al.
9,515,181 B2  12/2016 Fanelli
(Continued)

FOREIGN PATENT DOCUMENTS

KR    20170003526 A    1/2017
WO    2015130989 A1    9/2015

*Primary Examiner* — Moazzam Hossain
(74) *Attorney, Agent, or Firm* — Patterson + Sheridan, LLP

(57) ABSTRACT

A semiconductor device includes a dielectric isolation layer, a plurality of gates formed above the dielectric isolation layer, a plurality of source/drain regions above the dielectric isolation layer between the plurality of gates, and at least one contact placeholder for a backside contact. The at least one contact placeholder contacts a bottom surface of a first source/drain region of the plurality of source/drain regions. The semiconductor device further includes at least one backside contact contacting a bottom surface of a second source/drain region of the plurality of source/drain regions, and a buried power rail arranged beneath, and contacting the at least one backside contact.

16 Claims, 13 Drawing Sheets

(51) Int. Cl.
*H01L 29/165* (2006.01)
*H01L 29/40* (2006.01)
*H01L 29/417* (2006.01)
*H01L 29/423* (2006.01)
*H01L 29/66* (2006.01)
*H01L 29/786* (2006.01)

(56) References Cited

U.S. PATENT DOCUMENTS

| | | |
|---|---|---|
| 9,997,607 B2 | 6/2018 | Hook et al. |
| 10,636,739 B2 | 4/2020 | Beyne et al. |
| 10,797,139 B2 | 10/2020 | Morrow et al. |
| 10,833,003 B1 | 11/2020 | Chou et al. |
| 10,833,069 B2 | 11/2020 | Zhang et al. |
| 10,872,820 B2 | 12/2020 | Block et al. |
| 10,903,315 B2 | 1/2021 | Loubet et al. |
| 2012/0292777 A1 | 11/2012 | Lotz |
| 2019/0148222 A1 | 5/2019 | Enquist et al. |
| 2020/0105671 A1 | 4/2020 | Lai et al. |
| 2020/0266169 A1 | 8/2020 | Kang et al. |
| 2020/0373242 A1 | 11/2020 | Hiblot et al. |
| 2021/0111102 A1 | 4/2021 | Gambino et al. |
| 2024/0021684 A1* | 1/2024 | Lin .................... H01L 29/0673 |

* cited by examiner

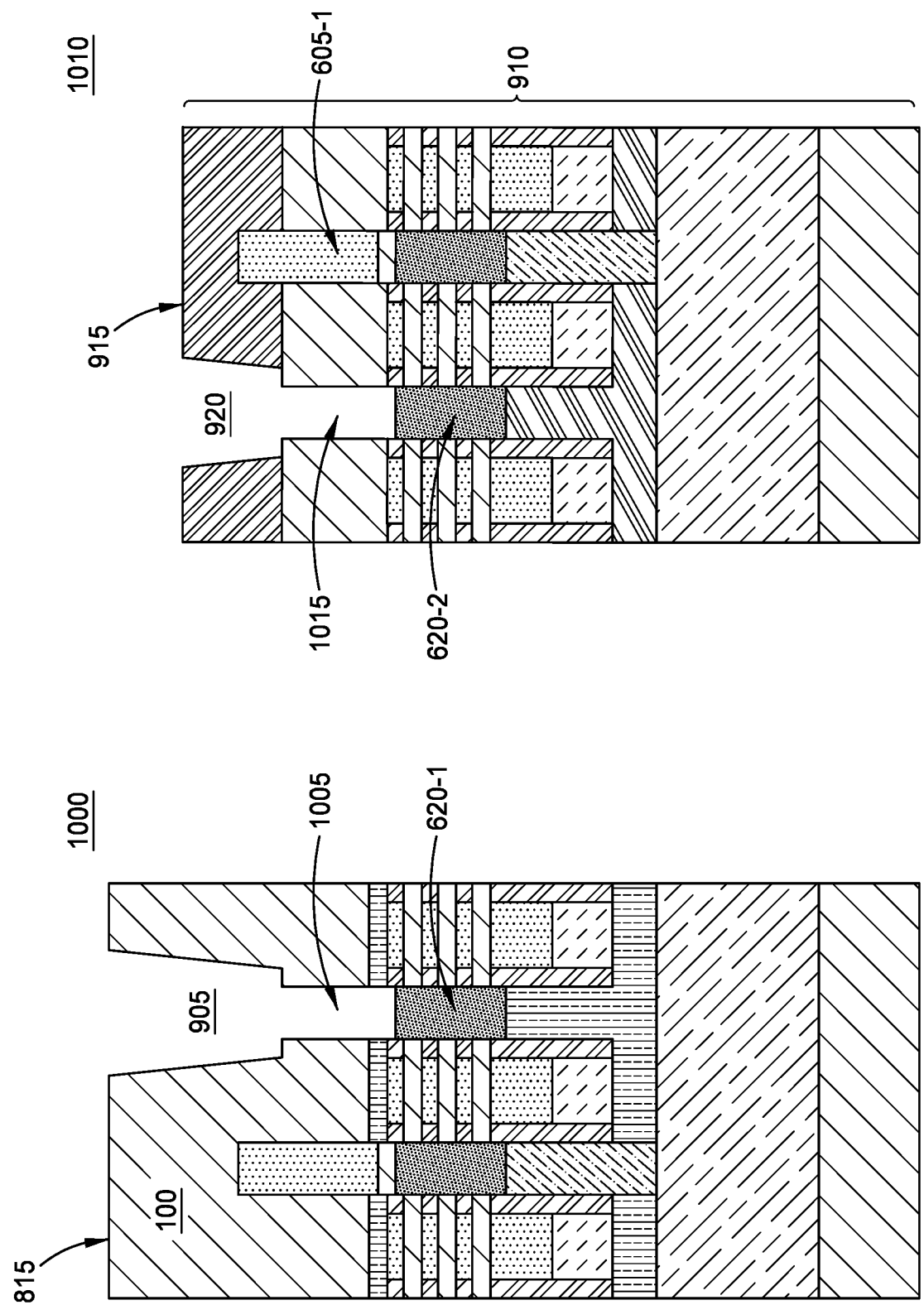

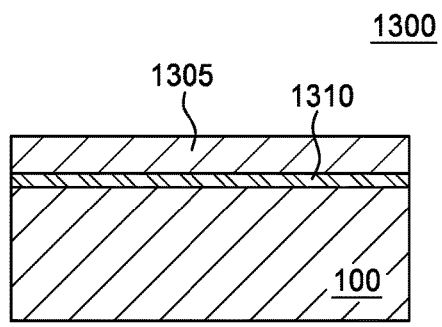
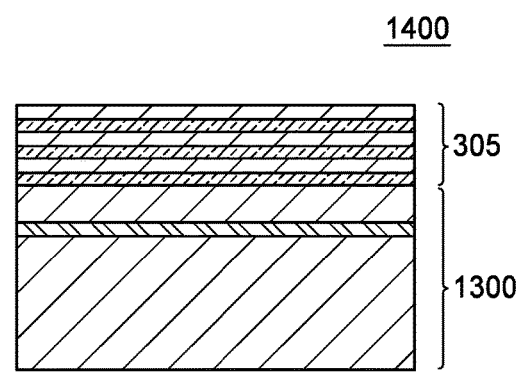
FIG. 13
FIG. 14
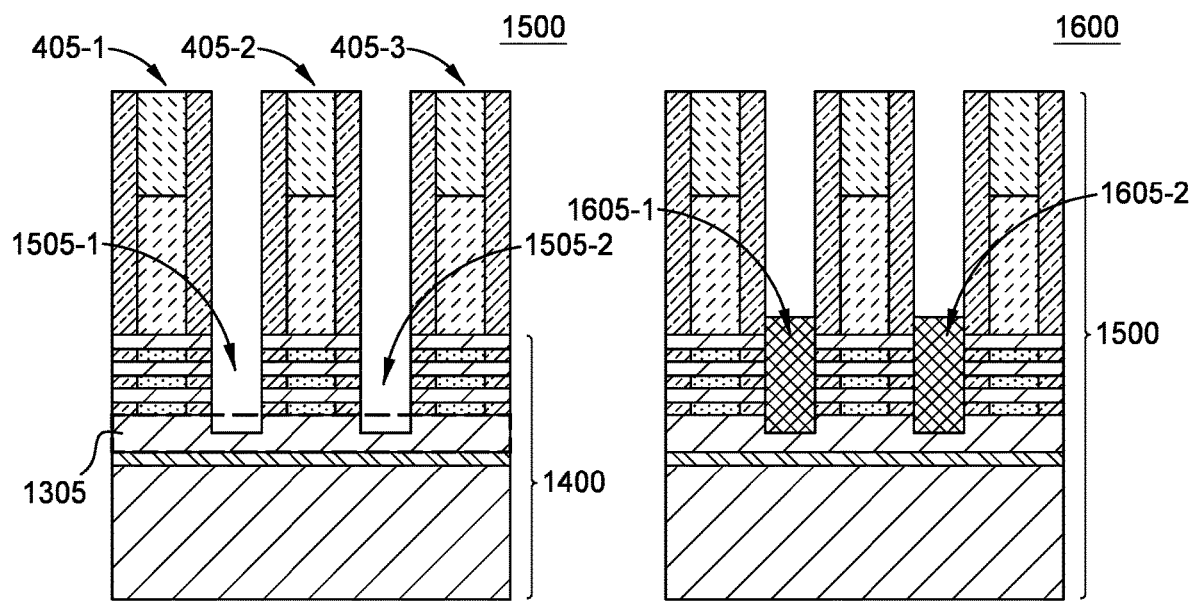
FIG. 15
FIG. 16

BACKSIDE ELECTRICAL CONTACTS TO BURIED POWER RAILS

BACKGROUND

The present disclosure generally relates to fabrication methods and structures for semiconductor devices, and more specifically, to techniques for forming backside electrical contacts to source and drain regions of a semiconductor device.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions. Nanosheet transistor configurations enable fuller depletion in the nanosheet channel regions and reduce short-channel effects.

A power delivery network of the semiconductor device includes power rails, which are conventionally formed in the semiconductor device during back-end-of-line (BEOL) processing. For example, the power rails may be formed within metal layers such as the M1 layer. In contrast, buried power rails (BPRs) may be formed in on the backside of the wafer when inverted after one or more BEOL layers are formed.

SUMMARY

According to one embodiment, a method comprises arranging a multi-layer stack on a top surface of a semiconductor substrate. The multi-layer stack comprises a nanosheet stack arranged above a dielectric isolation layer. The method further comprises arranging a plurality of dummy gates above the nanosheet stack, etching through the nanosheet stack between the plurality of dummy gates to form one or more trenches, depositing semiconductor material in the one or more trenches to form one or more source/drain regions; and exposing a bottom surface of the one or more source/drain regions. Exposing the bottom surface comprises reducing a thickness of the semiconductor substrate. The method further comprises forming an electrical contact that extends through one or more layers to the bottom surface, and forming a buried power rail that contacts the bottom surface through the electrical contact.

According to another embodiment, a method comprises arranging a nanosheet stack above a top surface of a silicon substrate, arranging a plurality of dummy gates above the nanosheet stack, and forming one or more contact placeholders between the plurality of dummy gates. Forming the one or more contact placeholders comprises etching through the nanosheet stack. The method further comprises forming one or more source/drain regions above the one or more contact placeholders, etching at least partly through the silicon substrate to the one or more contact placeholders, selectively etching the one or more contact placeholders to expose a bottom surface of the one or more source/drain regions, and forming an electrical contact that extends through one or more layers to the bottom surface.

According to another embodiment, a semiconductor device comprises a dielectric isolation layer, a plurality of gates formed above the dielectric isolation layer, a plurality of source/drain regions above the dielectric isolation layer between the plurality of gates, and at least one contact placeholder for a backside contact. The at least one contact placeholder contacts a bottom surface of a first source/drain region of the plurality of source/drain regions. The semiconductor device further comprises at least one backside contact contacting a bottom surface of a second source/drain region of the plurality of source/drain regions. And a buried power rail arranged beneath, and contacting the at least one backside contact.

According to another embodiment, a semiconductor device comprises a dielectric layer, a plurality of gates formed above the dielectric layer, one or more source/drain regions above the dielectric layer between the plurality of gates, and one or more vias extending through the dielectric layer. The one or more vias are arranged beneath, and contact a bottom surface of, the one or more source/drain regions. The semiconductor device further comprises one or more buried power rails arranged beneath, and contacting the one or more vias.

BRIEF DESCRIPTION OF THE SEVERAL VIEWS OF THE DRAWINGS

FIGS. 10A, 10B illustrate selectively etching one or more contact placeholders to expose a bottom surface of one or more source/drain regions, according to one or more embodiments.

FIG. 13 illustrates a silicon layer above a dielectric isolation layer, according to one or more embodiments.

FIG. 14 illustrates a nanosheet stack above a silicon layer, according to one or more embodiments.

FIG. 15 illustrates arranging a plurality of dummy gates above a nanosheet stack, and etching through the nanosheet stack to form one or more trenches, according to one or more embodiments.

FIG. 16 illustrates forming one or more source/drain regions, according to one or more embodiments.

DETAILED DESCRIPTION

Figure 1:
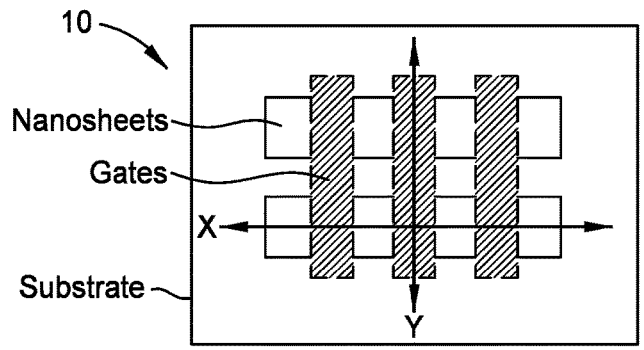
FIG. 1 is a top view of a semiconductor device, according to one or more embodiments.

According to embodiments described herein, a method comprises arranging a multi-layer stack on a top surface of a semiconductor substrate. The multi-layer stack comprises a nanosheet stack arranged above a dielectric isolation layer. The method further comprises arranging a plurality of dummy gates above the nanosheet stack, and etching through the nanosheet stack between the plurality of dummy gates to form one or more trenches. The method further comprises depositing semiconductor material in the one or more trenches to form one or more source/drain regions, and exposing a bottom surface of the one or more source/drain regions. Exposing the bottom surface comprises reducing a thickness of the semiconductor substrate. The method further includes forming an electrical contact that extends through one or more layers to the bottom surface, and forming a buried power rail that contacts the bottom surface through the electrical contact.

Beneficially, the method enables an implementation of a semiconductor device with a contact placeholder for a self-aligned contact to be formed beneath the source/drain regions. The contact placeholder may be formed of a dielectric material, or of a semiconductor material such as silicon germanium (SiGe). The self-aligned contact is formed from a backside of the wafer by selectively etching through the contact placeholder.

The method further enables an implementation of a semiconductor device having a nanosheet gate stack and source/drain regions formed above a dielectric material. Vias may be formed over the source/drain regions to connect to buried power rails that are directly overlapping with the source/drain regions. Beneficially, the semiconductor device need not require shallow trench isolation (STI) module for the nanosheet stack, while retaining strain with full dielectric isolation, and offering a lower resistance of buried power rails.

To provide a brief overview of relevant technology, for nanosheet devices formed on a bulk substrate, the source and drain regions may be epitaxially grown from (1) the side of the silicon nanosheets and (2) the bottom silicon substrate. This epitaxial growth gives rise to parasitic source and drain leakage that hinders nanosheet FET performance. Particularly, the combination of the (1) epitaxy contacting the substrate in the source/drain region and (2) the high-K metal gate (HKMG) stack formed directly on the substrate in the sub-fin region form a bottom parasitic planar transistor that degrades the performance of the gate-all-around nanosheet FET.

Various embodiments of the disclosure provide integration methods that form full bottom dielectric isolation of nanosheet FETs and/or FinFETs. Accordingly, the bottom dielectric isolation layer isolates the source and drain regions from the substrate and/or isolates the nanosheet region (or sub-Fin region) from the substrate. Particularly, some embodiments provide silicon-on-insulator (SOI)-like isolation on a bulk substrate without requiring additional masks to form anchors in the fabrication process. Notably, the techniques discussed herein may be applied to other types of semiconductor devices not including a nanosheet stack, such as FinFETs, planar devices, and so forth.

FIG. 1 depicts a simple diagram of a top view of a semiconductor device 10 according to various embodiments. FIG. 1 is intended only for reference and illustrates a top-down view of locations and relative orientations of the nanosheets and future gates during fabrication. For simplicity and ease of understanding, FIG. 1 omits some elements and/or layers so as to not obscure the figure. Subsequent figures (i.e., FIGS. 2A, 2B, . . . 11, 13, 14, . . . , 21) depict a cross-sectional view of the semiconductor device 10 of FIG. 1 taken along line X.

Figure 2A:
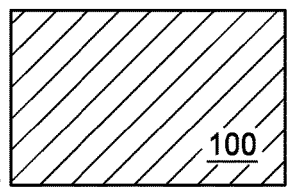
FIG. 2A illustrates a semiconductor substrate, according to one or more embodiments.
Figure 2B:
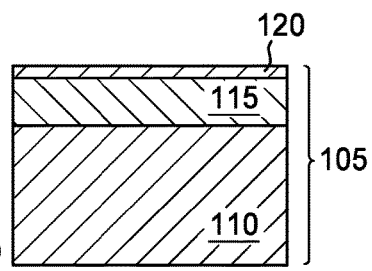
FIG. 2B illustrates a silicon-on-insulator (SOI) wafer, according to one or more embodiments.
Figure 3A:
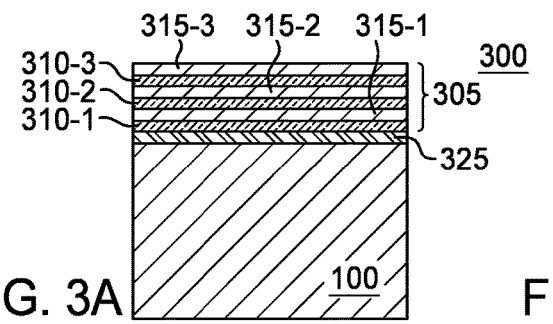
FIGS. 3A, 3B illustrate arranging a nanosheet stack above, respectively, a dielectric isolation layer and above a buried oxide layer, according to one or more embodiments.

FIGS. 2A, 2B, 3A, . . . , 11A illustrate exemplary fabrication sequences that form backside electrical contacts to source and drain regions of a semiconductor device using contact placeholders. More specifically, FIGS. 2A, 3A, . . . , 6A illustrate various operations of a first fabrication sequence beginning with a silicon (Si) substrate 100, while FIGS. 2B, 3B, . . . , 6B illustrate various operations of a second fabrication sequence beginning with a silicon-on-insulator (SOI) wafer 105. FIGS. 7, 8, . . . 11 continue the fabrication sequence of FIGS. 2A, 3A, . . . , 6A but the illustrated operations will be understood to be similarly applicable to the fabrication sequence of FIGS. 2B, 3B, . . . , 6B. Moreover, any operations, features, benefits, etc. that are described with respect to a particular fabrication sequence will be understood to be similarly applicable to the other fabrication sequence, unless otherwise explicitly noted.

In some embodiments, the starting substrate of FIG. 2A comprises the silicon substrate 100, although other semiconductor materials are contemplated. In another embodiment, the starting substrate of FIG. 2B comprises a SOI wafer. The SOI wafer 105 comprises a silicon substrate 110, a buried oxide (BOX) layer 115 above the silicon substrate 110, and a surface semiconductor layer 120.

The surface layer 120 may have a thickness in a range between less than 100 nanometers (nm) to greater than a micron. In some embodiments, the surface layer 120 has a thickness between 10 and 300 nanometers (nm). A thickness of the BOX layer 115 may vary depending on the specific application. In some embodiments, the BOX layer 115 has a thickness between 30 and 200 nm. The thickness of the silicon substrate 110 may vary widely depending on the specific application. For example, the silicon substrate 110 may have a thickness similar to that of a typical semiconductor wafer (e.g., 100-700 microns), or the silicon substrate 110 may be thinned and mounted on another substrate.

In assembly 300 of FIG. 3A, a nanosheet stack 305 is arranged above the sacrificial isolation layer 325. In assembly 320 of FIG. 3B, the nanosheet stack 305 is arranged above the BOX layer 115. The nanosheet stack 305 comprises an alternating arrangement of Si layers 315-1, 315-2, 315-3 and SiGe layers 310-1, 310-2, 310-3. Although three (3) Si layers and three (3) SiGe layers are shown, other numbers of Si layers and SiGe layers are contemplated. The nanosheet stack 305 may be further processed to define NFET region(s) and PFET region(s) of the semiconductor device.

The Si layers 315-1, 315-2, 315-3 and SiGe layers 310-1, 310-2, 310-3 may be epitaxially grown above the sacrificial isolation layer 325 (or above the BOX layer 115). As used herein, the term "epitaxially grown" means the growth of a semiconductor (crystalline) material on a deposition surface of another semiconductor (crystalline) material, in which the semiconductor material being grown (crystalline overlayer) has substantially the same crystalline characteristics as the semiconductor material of the deposition surface (seed material). In an epitaxial growth process, chemical reactants provided by source gases, as well as system parameters, are controlled to cause the depositing atoms to arrive at the deposition surface with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface. For example, an epitaxially grown semiconductor material deposited on a {100} orientated crystalline surface will take on a {100} orientation. In some embodiments, epitaxial growth processes are selective to forming on semiconductor surfaces, and generally do not deposit material on exposed surfaces such as silicon dioxide or silicon nitride surfaces.

The SiGe layers 310-1, 310-2, 310-3 may have any suitable atomic percentage of Ge. For convenience and ease of understanding, SiGe layers having a relatively lesser atomic percentage of Ge (such as the SiGe layers 310-1, 310-2, 310-3) will be referred as SiGe(x). In some embodiments, the SiGe(x) layers have a Ge concentration (x) from 5 atomic percent to 50 atomic percent. In some embodiments, the SiGe(x) layers have a Ge concentration from 10 atomic percent to 40 atomic percent. In some embodiments, the SiGe(x) layers have a Ge concentration from 20 atomic percent to 30 atomic percent.

In some embodiments, the layers of the nanosheet stack 305 have a thickness less than or comparable to that of the sacrificial isolation layer 325. In some embodiments, the Si layers 315-1, 315-2, 315-3 have a thickness of 4 to 10 nm, and the SiGe(x) layers 310-1, 310-2, 310-3 have a thickness of 8 to 15 nm. In one non-limiting example, the sacrificial isolation layer 325 has a thickness of about 10 nm, the Si layers 315-1, 315-2, 315-3 have a thickness of about 6 nm, and the SiGe(x) layers 310-1, 310-2, 310-3 have a thickness of about 10 nm.

The sacrificial isolation layer 325 may be SiGe layer with a relatively greater Ge concentration than the SiGe(x) layers 310-1, 310-2, 310-3. In some embodiments, the sacrificial isolation layer 325 may be a SiGe(x+25) layer having a Ge concentration that is at least 25 atomic percent greater than the SiGe(x) layers. In some embodiments, the nanosheet stack 305 may include one or more SiGe(x+25) layers in addition to the SiGe(x) layers. The greater Ge concentration in the SiGe(x+25) layers provides an etch selectivity greater than or equal to 30:1 relative to the lesser Ge concentration SiGe(x) layers. For example, the SiGe(x+25) layers may be selectively removed using HCl vapor etch chemistry.

In some embodiments, the nanosheet stack 305 is formed by growing epitaxy layers above the silicon substrate 100 (FIG. 3A) as follows: a first SiGe layer having a high Ge concentration (e.g., greater than 50%) as a sacrificial isolation layer, and subsequent alternating layers of SiGe (e.g., 20-35% Ge) and Si above the sacrificial isolation layer.

In some embodiments, the nanosheet stack 305 is formed (FIG. 3B) as follows. The surface layer 120 of the SOI wafer 105 is thinned to have a thickness of approximately 5 to 10 nm. A layer of SiGe (30-60% Ge) is grown above the thinned surface layer 120. One example thickness of the SiGe layer is approximately 10 nm. An oxidation process is performed to intermix the Si of the surface layer 120 with the SiGe layer to form a lower-concentration SiGe layer (20-40% Ge) with $SiO_2$ formed above. The $SiO_2$ may be removed using dilute hydrofluoric acid (DHF), and subsequent alternating layers of Si and SiGe (e.g., 20-35% Ge) may be grown above the lower-concentration SiGe layer. The nanosheet stack 305 is further patterned so an unwanted portion of the nanosheet stack 305 is removed to define nanosheet Fins, and shallow trench isolations (STI) are formed between the neighboring nanosheet Fins (not shown in X-cut).

Figure 4A:
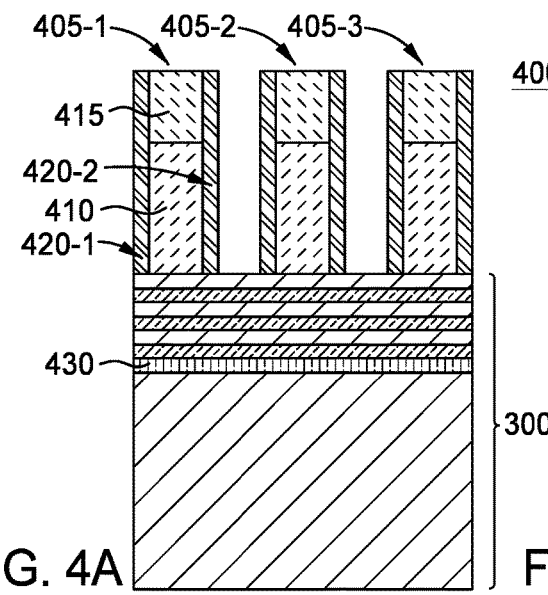
FIGS. 4A, 4B illustrate arranging a plurality of dummy gates above a nanosheet stack, according to one or more embodiments.
Figure 4B:
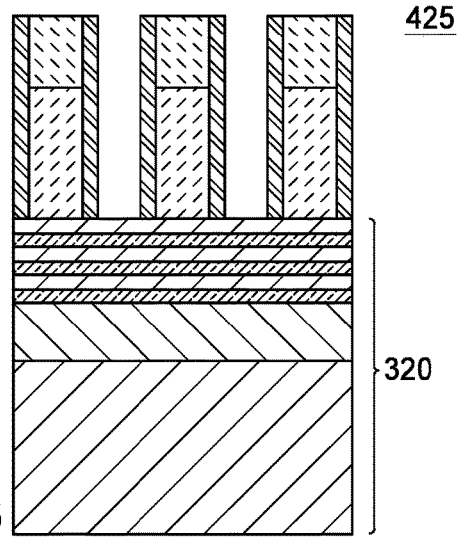

In assembly 400 of FIG. 4A, and in assembly 425 of FIG. 4B, a plurality of dummy gates 405-1, 405-2, 405-3 are arranged above the nanosheet stack 305. In some embodiments, the dummy gates 405-1, 405-2, 405-3 are formed by depositing dummy gate material 410, such as a thin layer of $SiO_2$ followed by amorphous Si, on the relevant layer. The dummy gate material 410 may be planarized to a desired level. A hard mask gate cap 415 is formed on the dummy gate material 410. The hard mask gate cap 415 may be a nitride, oxide, and/or a combination nitride and oxide multilayer. Although not shown, in some embodiments, a pad oxide may be deposited on the dummy gate material 410 prior to forming the hard mask gate cap 415. In some embodiments, the dummy gates 405-1, 405-2, 405-3 are formed by patterning the hard mask gate cap 415, and then using the patterned hard mask gate cap 415 to etch the dummy gate material 410 into the dummy gates 405-1, 405-2, 405-3. After that, to form the dielectric isolation layer 430, the sacrificial isolation layer 325 may be selectively etched, using HCl or C1F3, without etching the alternating layers of SiGe and Si. Although the alternating layers would appear as floating in cross-sectional views, it noted that the layers (including the nanosheet stack 305) are anchored to the dummy gates 405-1, 405-2, 405-3 as depicted in FIG. 4A.

After that, conformal deposition of a low-K spacer material forms the dielectric isolation layer 430 and gate spacers 420-1, 420-2. Some examples of the low-K spacer material include silicon boron carbide nitride (SiBCN), SiO, SiOC, SiOCN, and so forth. Thus, the dielectric isolation layer 430 in FIGS. 4A, etc. provides an SOI-like full isolation without requiring use of an SOI substrate as in FIGS. 3B, 4B, etc. One exemplary method of forming the dielectric isolation layer 430 is described in U.S. Pat. No. 10,903,315, which is herein incorporated by reference in its entirety. Each of the dummy gates 405-1, 405-2, 405-3 has gate spacers 420-1, 420-2 formed along sidewalls defined by the dummy gate material 410 and the hard mask gate cap 415 In one embodiment, the gate spacers 420-1, 420-2 are formed by a conformal deposition of a dielectric material (e.g., silicon oxide, silicon nitride, silicon oxynitride, SiBCN, SiOCN, SiOC, or any suitable combination of those materials) followed by a directional etch (e.g., reactive ion etch (RIE)).

Figure 5A:
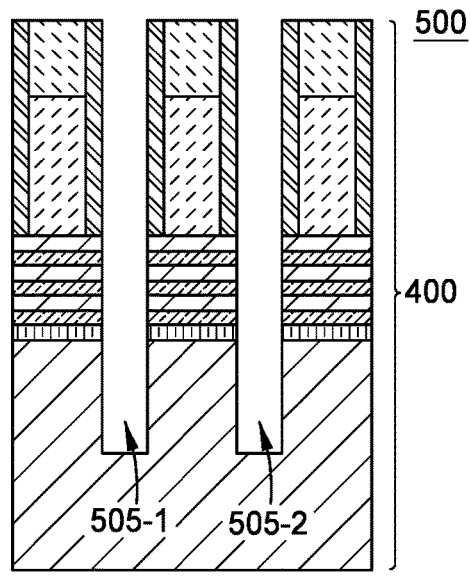
FIGS. 5A, 5B illustrate etching through a nanosheet stack to form one or more trenches, according to one or more embodiments.

In assembly 500 of FIG. 5A, one or more etch processes are performed to etch through the nanosheet stack 305, through the dielectric isolation layer 430, and partly through the semiconductor substrate 100 to form trench 505-1 between the dummy gates 405-1, 405-2, and to form trench 505-2 between the dummy gates 405-2, 405-3.

Figure 5B:
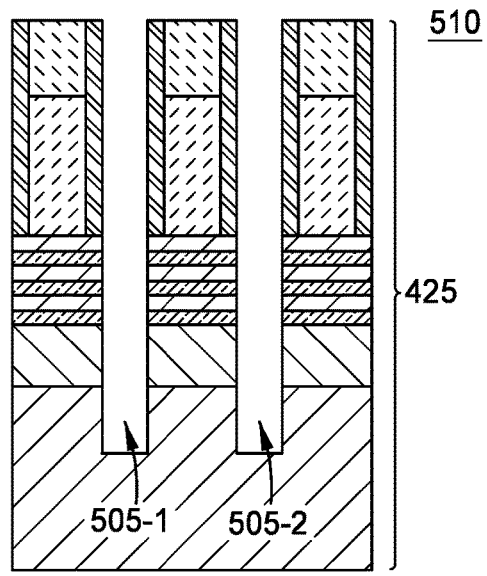

In assembly 510 of FIG. 5B, one or more etch processes are performed to etch through the nanosheet stack 305 and at least partly through the BOX layer 115. In some embodiments, the etch extends partly through the BOX layer 115. In other embodiments, the etch extends through the BOX layer 115 and partly through the semiconductor substrate 110. As will be discussed below, the depth of the etch may depend on the sacrificial material selected to operate as a contact placeholder.

Figure 6A:
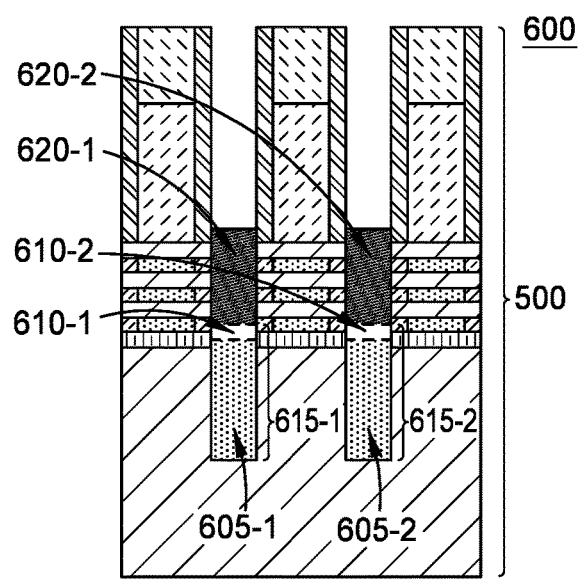
FIGS. 6A, 6B illustrate forming one or more contact placeholders and one or more source/drain regions, according to one or more embodiments.
Figure 6B:
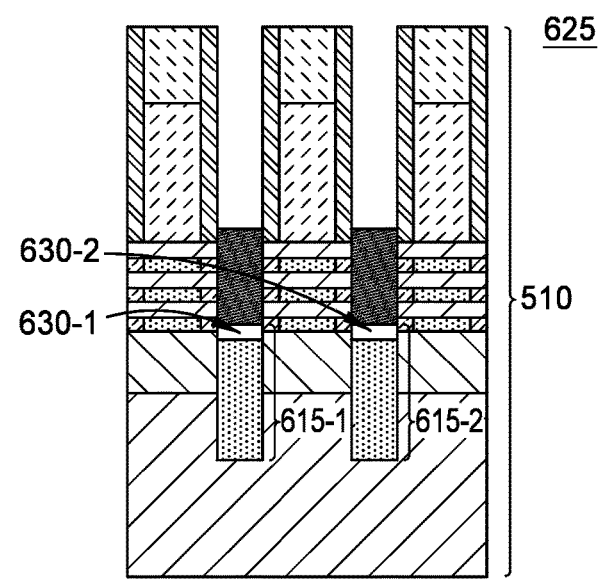

FIGS. 6A, 6B illustrate forming inner spacers to seal the sacrificial SiGe layers 310-1, 310-2, and 310-3, followed by forming one or more contact placeholders 615-1, 615-2 and one or more source/drain regions 620-1, 620-2. In assembly 600 of FIG. 6A, and in assembly 625 of FIG. 6B, the sacrificial SiGe(x) layers 310-1, 310-2 and 310-3 are selectively etched such that a cavities are formed under the spacer region. After that, inner spacer is formed by a conformal dielectric liner deposition followed by isotropic dielectric liner etch back. The material of the inner spacer could be the same or similar to the gate spacer material 420-1 and 420-2. In assembly 600 of FIG. 6A, and in assembly 625 of FIG. 6B, a sacrificial material 605-1, 605-2 is then formed in the trenches 505-1, 505-2. The sacrificial material 605-1, 605-2 forms some or all of the contact placeholders 615-1, 615-2, which may be used to form self-aligned electrical contacts to the source/drain regions 620-1, 620-2 in subsequent operations.

In some embodiments, the sacrificial material 605-1, 605-2 comprises a dielectric material, such as silicon dioxide, SiC, SiOC, AlOx, etc. In this case, the sacrificial material 605-1, 605-2 extends through the regions 610-1, 610-2, and the semiconductor material used to form the source/drain regions 620-1, 620-2 is deposited above and contacts the sacrificial material 605-1, 605-2. In some embodiments, the semiconductor material of the source/drain regions 620-1, 620-2 comprises SiGe having a Ge concentration greater than that of the SiGe(x), such as SiGe(x+25), although other types of semiconductor materials are also contemplated.

In some embodiments, the sacrificial material 605-1, 605-2 comprises a semiconductor material, such as SiGe(x+25), and a different semiconductor material is deposited in the regions 610-1, 610-2 to form semiconductor buffers 630-1, 630-2 that separate the sacrificial material 605-1, 605-2 from the semiconductor material of the source/drain regions 620-1, 620-2 when deposited. In this case, the source/drain regions 620-1, 620-2 contact the semiconductor buffers 630-1, 630-2. In some embodiments, the semiconductor buffers 630-1, 630-2 are formed of Si, although other types of semiconductor materials are also contemplated.

Figure 7B:
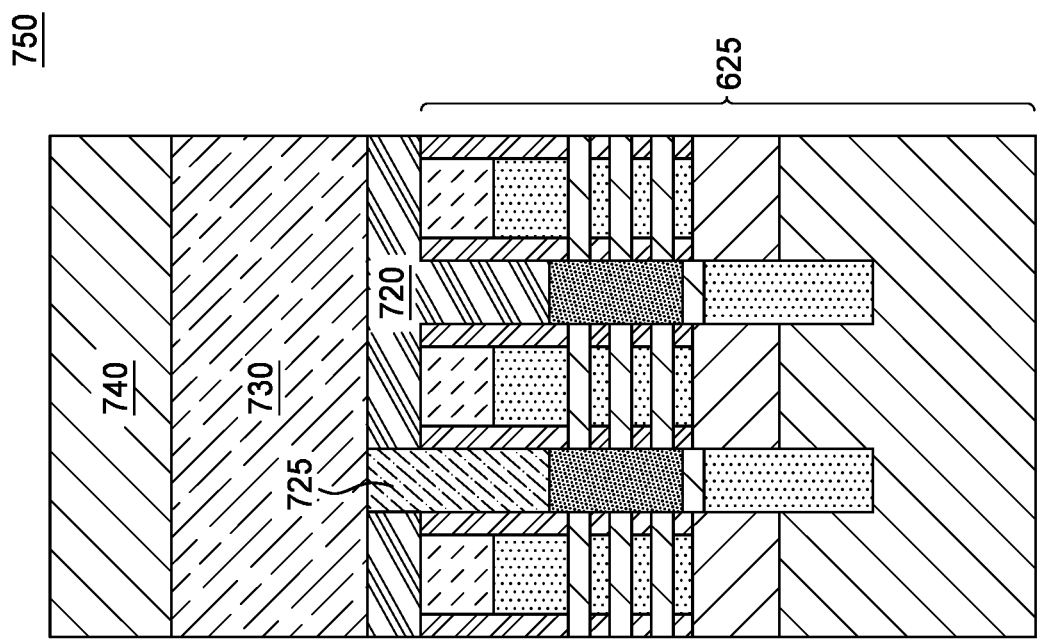
FIGS. 7A, 7B illustrate performing one or more additional front end of line (FEOL) processes and one or more back end of line (BEOL) processes, and bonding a carrier wafer to a top surface defined by the one or more BEOL processes, according to one or more embodiments.
Figure 7A:
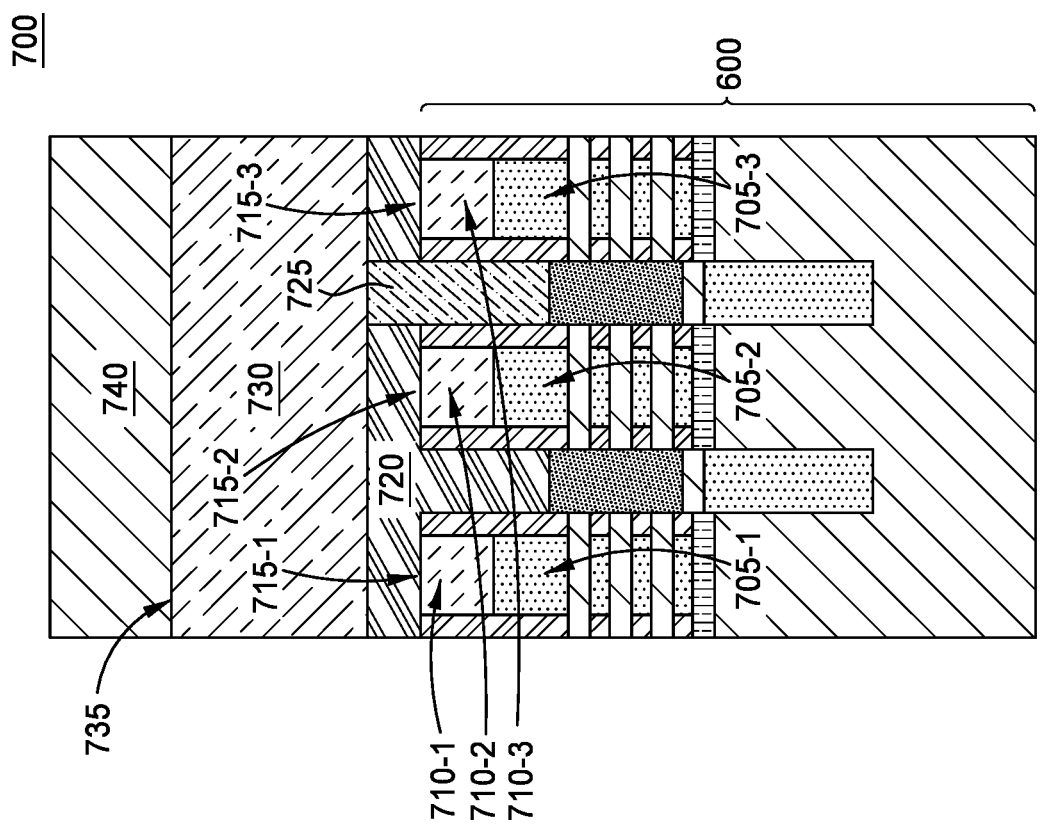

FIGS. 7A, 7B illustrate performing one or more additional front end of line (FEOL) processes and one or more back end of line (BEOL) processes, and bonding a carrier wafer 740 to a top surface 735 defined by the one or more BEOL processes. While the operations of FIGS. 7-11 are specifically performed with reference to the fabrication sequence of FIGS. 2A, 3A, . . . , 6A, the operations are also applicable to the fabrication sequence of FIGS. 2B, 3B, . . . , 6B.

In assembly 700 of FIG. 7A, and assembly 750 of FIG. 7B, the one or more FEOL processes comprise forming an interlayer dielectric (ILD) layer 720 above the source/drain regions 620-1, 620-2, removing the hard mask gate cap 415 and the dummy gate material 410 of the dummy gates 405-1, 405-2, 405-3, and forming gates 715-1, 715-2, 715-3 in the openings formed between the gate spacers 420-1, 420-2. In some embodiments, forming the gates 715-1, 715-2, 715-3 comprises filling the openings with one or more gate materials 705-1, 705-2, 705-3. The one or more FEOL processes may further comprise arranging gate caps 710-1, 710-2, 710-3 above the gate materials 705-1, 705-2, 705-3.

In some embodiments, the one or more gate materials 705-1, 705-2, 705-3 comprise a gate dielectric layer and a conductive gate metal. For example, the one or more gate materials 705-1, 705-2, 705-3 may form a high-k/metal gate. In some embodiments, the gate dielectric layer comprises a high-dielectric constant (high-k) material, such as hafnium oxide ($HfO_2$), that is conformally deposited into the opening formed between the gate spacers 420-1, 420-2. Other types of high-k materials are also contemplated, and in some cases may include dopants. The high-k material thus conforms to the profile of the opening and the channel regions of the nanosheet stack 305. The gate dielectric layer can be deposited by chemical vapor deposition (CVD), atomic layer deposition (ALD), or any other suitable technique. The gate dielectric layer may have a thickness in the non-limiting range of about 0.7 nm to about 3 nm.

The conductive gate metal of the one or more gate materials 705-1, 705-2, 705-3 may be formed by depositing an electrically conductive material into the opening formed between the gate spacers 420-1, 420-2. The conductive gate metal may be formed of any suitable conducting material, such as a semiconductor material, a metal, a conductive metallic compound, carbon nanotubes, conductive carbon, graphene, or any suitable combinations thereof. In some cases, the conductive material may further include dopants. Conductive metal comprises workfunction metals such as TiN, TiAlC, TiC, etc, and optionally low resistance capping metals, such as W, Al, etc.

In some embodiments, the conductive gate metals of the gates 715-1, 715-2, 715-3 are partially recessed to form a cavity, which is then backfilled with dielectric material, such as silicon nitride (SiN), to form the gate caps 710-1, 710-2, 710-3. In alternate embodiments, the conductive gate metals extend to a top of the gate spacers 420-1, 420-2, and may be formed using a chemical-mechanical planarization (CMP) process to remove excess material from the upper surface. Accordingly, the conductive gate metal surrounds the entire circumference of the active layers of the nanosheet stack 305.

In some embodiments, the one or more FEOL processes comprise depositing dielectric material after forming the source/drain regions 620-1, 620-2, and before removing the gate cap and dummy gate. In some embodiments, the one or more FEOL processes comprise depositing the ILD layer 720 above the gates 715-1, 715-2, 715-3, and forming an electrical contact 725 (that is, a frontside contact) through the ILD layer 720 to the source/drain region 620-2. The ILD layer 720 may be formed of any suitable dielectric material, such as silicon dioxide.

In some embodiments, the one or more BEOL processes comprises forming one or more layers 730 above the ILD layer 720. In some embodiments, the one or more layers 730 comprise a plurality of metal and via layers separated by a plurality of dielectric layers. The plurality of metal layers provide interconnection between various components of the semiconductor device, e.g., connecting to the source/drain region 620-2 through the electrical contact 725. In some embodiments, a carrier wafer 740 is bonded to a top surface 735 of the one or more layers 730 to accommodate further handling and processing of the semiconductor device. Any suitable materials and bonding techniques for the carrier wafer 740 are contemplated and will be understood by the person of ordinary skill in the art.

FIG. 8 illustrates reducing a thickness of the semiconductor substrate 100. In assembly 800, the assembly 700 has been inverted using the carrier wafer 740. The semiconductor substrate 100 is thinned, using any suitable techniques, from a first thickness 805 to a second thickness 810 to define a bottom surface 815 of the semiconductor substrate 100. For example, the semiconductor substrate 100 may be thinned using a combination of a backside grinding process, CMP process, or a wet/dry etch.

Figure 8B:
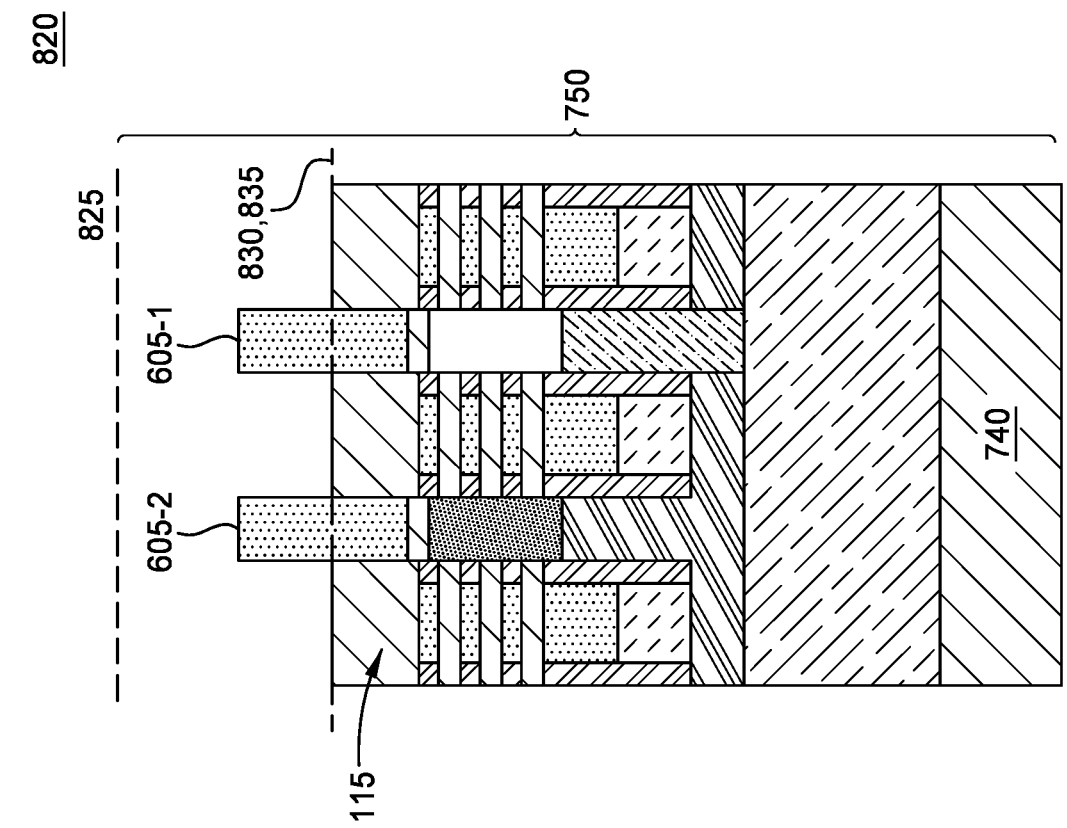
FIGS. 8A, 8B illustrate reducing a thickness of a semiconductor substrate, according to one or more embodiments.
Figure 8A:
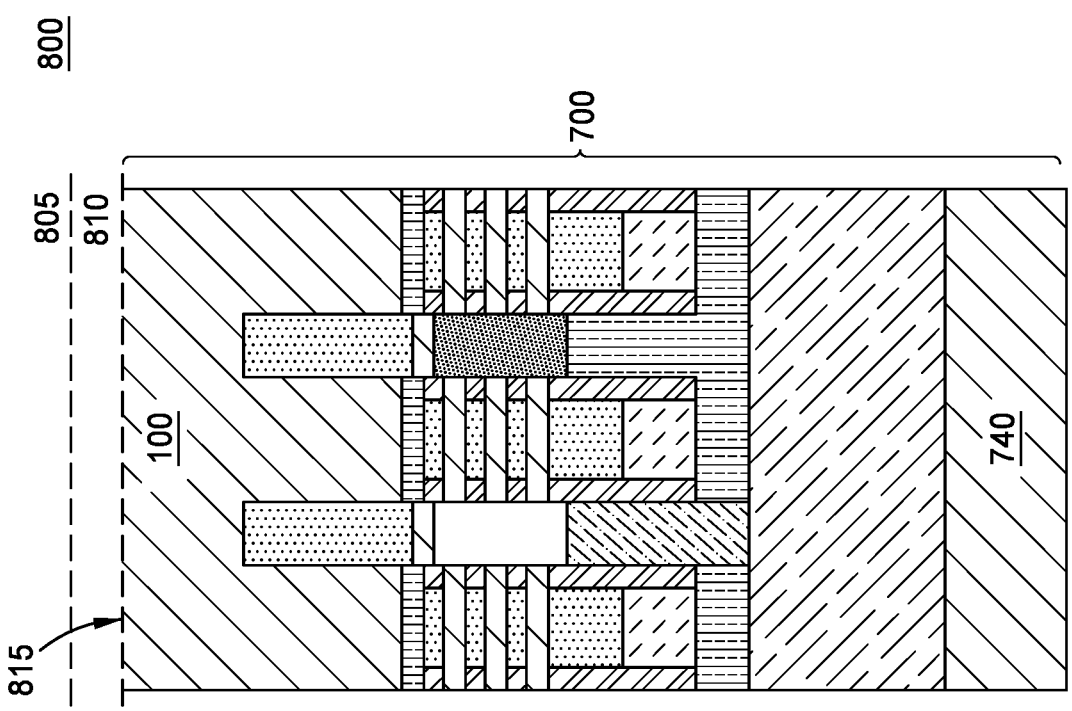

In SOI-based implementations such as assembly 820 of FIG. 8B, after the FEOL process(es) and BEOL process(es) and bonding the carrier wafer 740, the substrate (e.g., the silicon substrate 110) is thinned from a first thickness 825 to a second thickness 830. In some embodiments, the second thickness 830 corresponds to a top surface 835 of the BOX layer 115 (e.g., entirely removing the silicon substrate 110). In some cases, the sacrificial material 605-1, 605-2 of the contact placeholders 615-1, 615-2 extends beyond a top surface of the BOX layer 115 (as shown in the inverted configuration), such that the sacrificial material 605-1, 605-2 protrudes when the silicon substrate 110 is removed. An interlayer dielectric (ILD) may be deposited above the BOX layer 115 and the sacrificial material 605-1, 605-2.

Figures 9A, 9B:
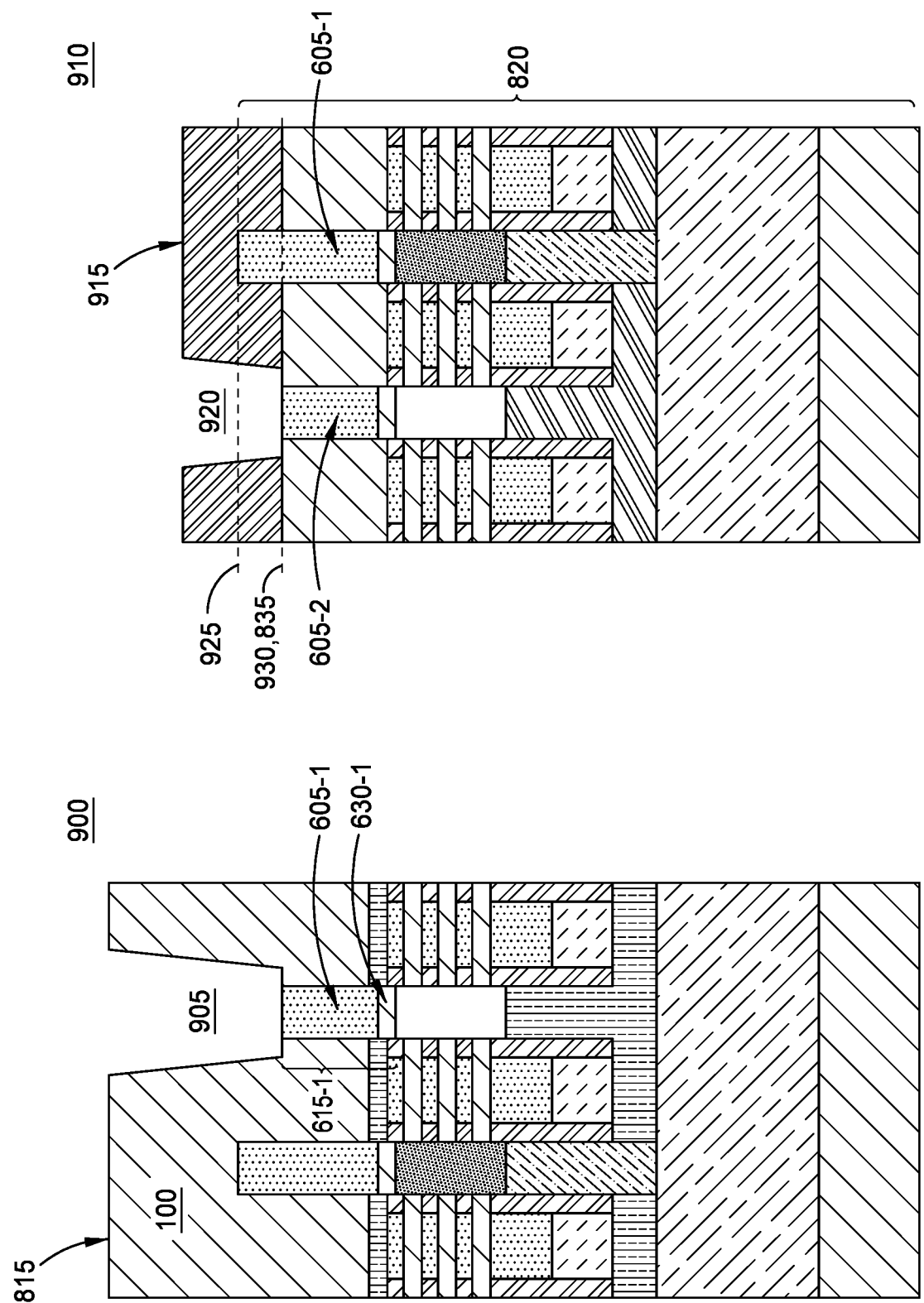
FIG. 9A illustrates etching at least partly through a semiconductor substrate to one or more contact placeholders, according to one or more embodiments.
FIG. 9B illustrates etching at least partly through an interlayer dielectric (ILD) layer to one or more contact placeholders, according to one or more embodiments.

FIG. 9A illustrates etching at least partly through the semiconductor substrate 100 to the contact placeholder 615-1 (e.g., backside contact patterning). In assembly 900, an etch process is performed from the bottom surface 815 that defines an opening 905 in the semiconductor substrate 100. The opening 905 extends from the bottom surface 815 to a bottom surface of the contact placeholder 615-1. In some embodiments, the etch process is selective to the material of the semiconductor substrate 100 (e.g., Si). In other embodiments, the etch process is non-selective.

In SOI-based implementations such as assembly 910 of FIG. 9B, the backside contact patterning comprises etching through an ILD layer 915 to expose the sacrificial material 605-2 of the contact placeholder 615-2 at an opening 920. In some embodiments, the etching process etches partially through the sacrificial material 605-1. For example, the etching process may reduce a height of the sacrificial material 605-2 from a first height 925 to a second height 930, which in some cases corresponds to the top surface 835 of the BOX layer 115.

FIG. 10A illustrates selectively etching the contact placeholder 615-1 to expose a bottom surface of the source/drain region 620-1. In assembly 1000, the sacrificial material 605-1 is selectively etched (e.g., SiGe) relative to the semiconductor substrate 100 and, optionally, the semiconductor buffer 630-1 is selectively etched (e.g., Si) to define an opening 1005 that is in fluid communication with the opening 905. In some embodiments, one or more contact placeholders, such as the contact placeholder 615-2, remain in the completed semiconductor device. In SOI-based implementations such as assembly 1010 of FIG. 10B, the sacrificial material 605-1 and the semiconductor spacer may be selectively etched relative to the BOX layer 115 to form an opening 1015.

Figure 11A:
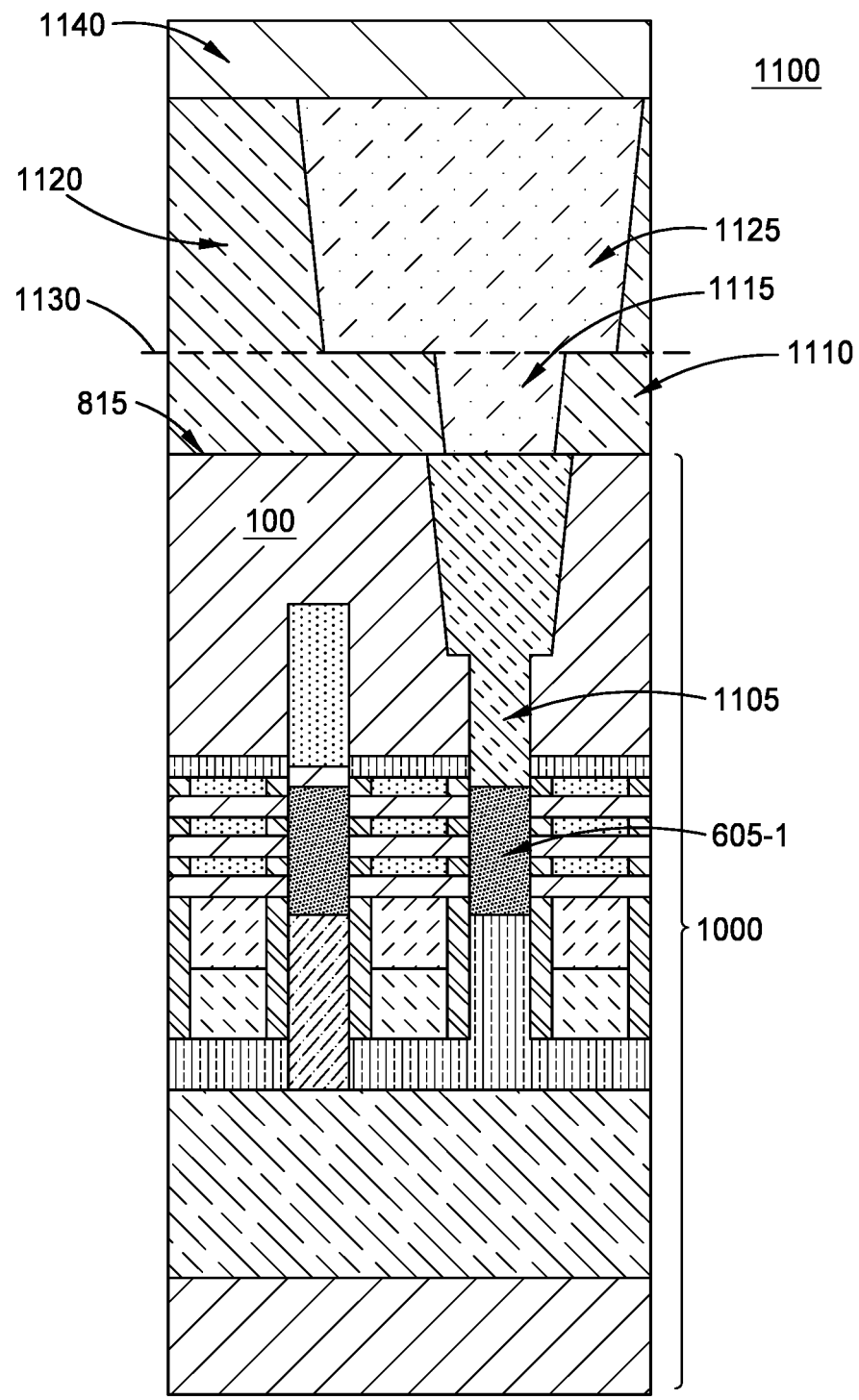
FIGS. 11A, 11B illustrate forming an electrical contact and forming a buried power rail that contacts one or more source/drain regions through the electrical contact, according to one or more embodiments.
Figure 11B:
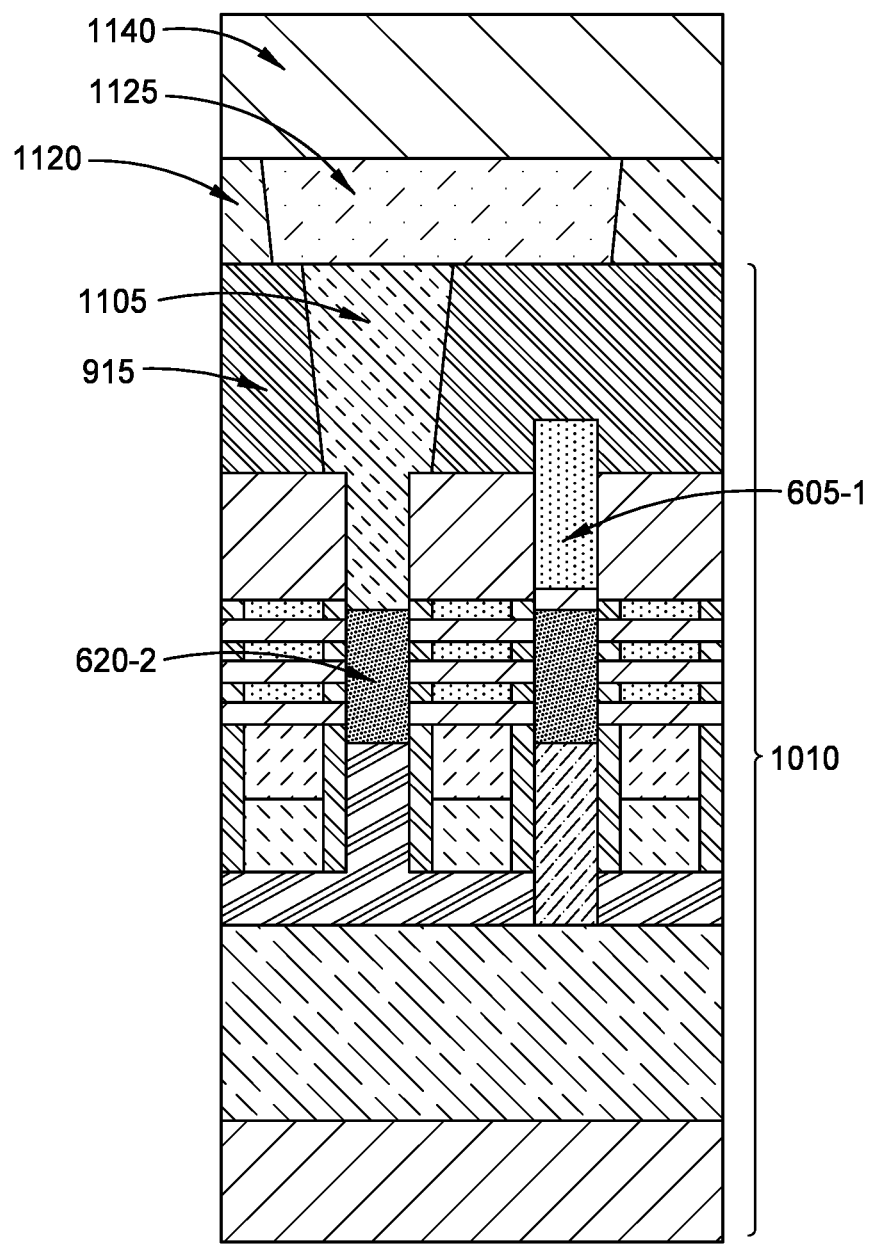

Assembly 1100 of FIG. 11A illustrates forming metallization inside the openings 905, 1005, and assembly 1135 of FIG. 11B illustrates forming metallization inside the openings 920, 1015. The metallization material of the electric contact 1105 (e.g., a backside contact) includes a silicide liner, such as Ti, Ni, NiPt, etc, followed by an adhesion layer, such as TiN, and conductive metal fill, such as Cu, W, Co or Ru. Optionally, a dielectric spacer can be deposited before the metal fills. After that, a CMP process is used to remove any material extending beyond the bottom surface 815 of the semiconductor substrate 100. Beneficially, the electrical contact 1105 will consistently align to the source/drain region 620-1 as it replaces the volume of the contact placeholder. Thus, the electrical contact 1105 represents a self-aligned electrical contact to S/D epitaxy that will not short to the gate. In this way, each of the assemblies 1100, 1135 may include one or more frontside contacts, one or more backside contacts, and/or one or more contact placeholders.

After that, an interlayer dielectric (ILD) layer 1110 is arranged above the bottom surface 815 (referenced to the inverted configuration of the assembly 1100), and the buried power rail 1125 and via connection 1115 between the buried power rail 1125 and electrical contact 1105 are formed through the ILD layer 1110. The ILD layer 1110, the buried power rail 1125, and the via connection 1115 may be formed of any suitable materials using any suitable techniques. For example, the buried power rail 1125 and via connection 1115 may be formed of Cu, Co or ruthenium (Ru). The ILD layer 1110 extends to a top surface 1120. A backside power distribution network 1140 can be formed above the top surface 1120 and contacts the buried power rail 1125 (not shown). In SOI-based implementations, dielectric spacer is not needed prior to the backside contact 1105 metallization. After that, buried power rail 1125 can be formed directly above the backside contact 1105 followed by the backside power distribution network 1140 as shown in FIG. 11B.

In some cases, the thickness of the dielectric isolation layer 430 of FIG. 4A is in the range of about 10 nm, and in assembly 1100 a majority of the electrical contact 1105 is still formed within the silicon substrate 100. Beneficially, the BOX layer 115 may have a thickness in the range of about 100 nm, which permits the electrical contact 1105 to be formed partly or fully within the BOX layer 115 and thereby reduces a chance of high leakage current between the backside contact and neighboring semiconductor material.

Figure 12:
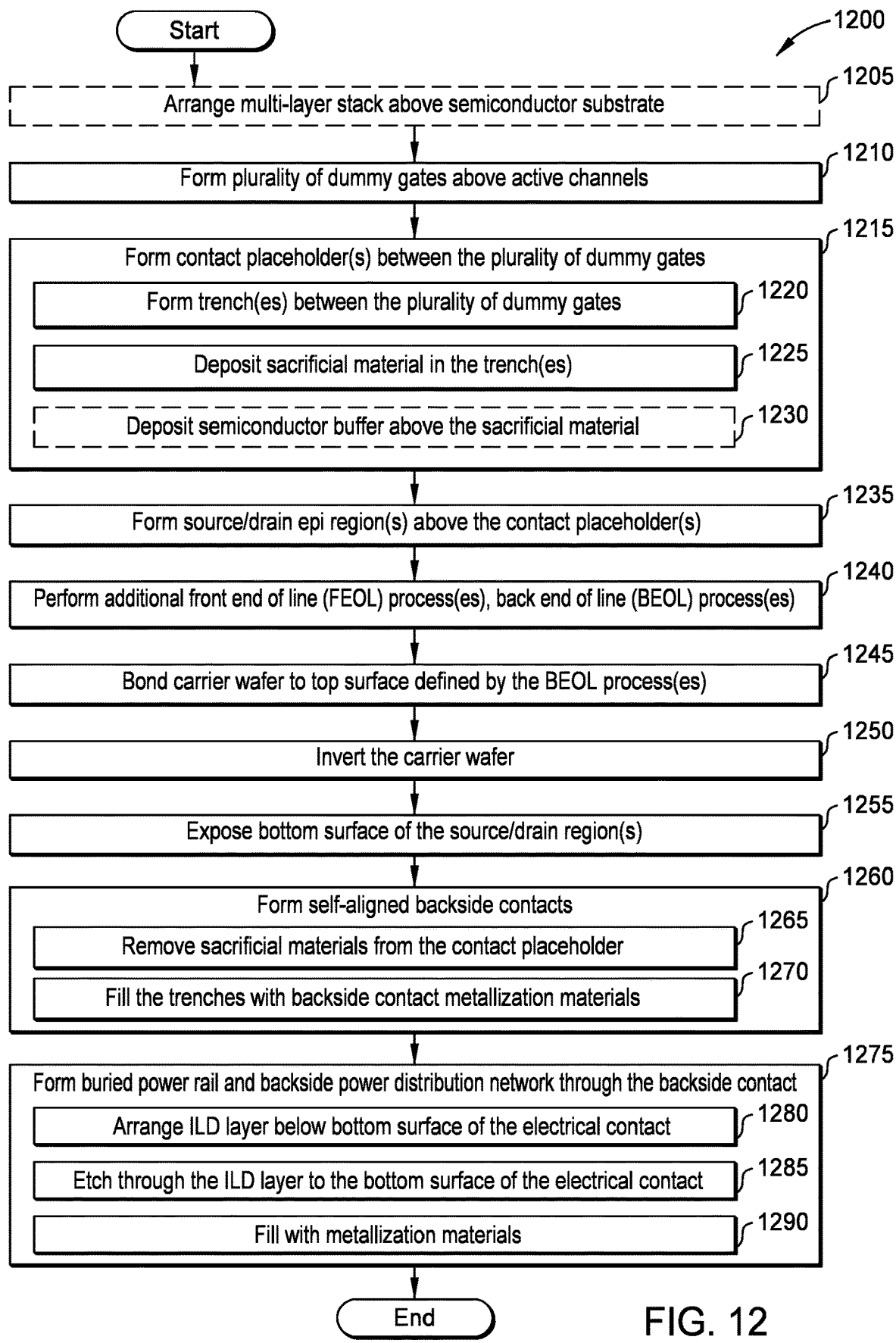
FIG. 12 is a method of fabricating a semiconductor device, according to one or more embodiments.

FIG. 12 is a method 1200 of fabricating a semiconductor device. The method 1200 may be used in conjunction with other embodiments, for example, any of the exemplary fabrication sequences of FIGS. 1A, 2A, ..., 11A, FIGS. 1B, 2B, ..., 11B. Additionally, the method 1200 may be used in conjunction with the fabrication sequence of FIGS. 13, 14, ..., 21 that is discussed below.

Figure 3B:
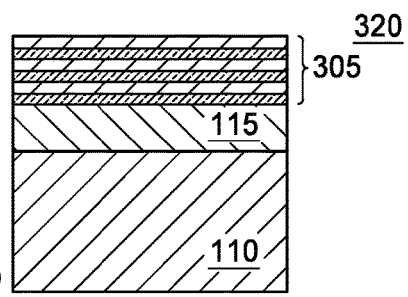

The method 1200 optionally begins at block 1205, where a multi-layer stack is arranged above a semiconductor substrate. In some embodiments, the multi-layer stack comprises a nanosheet stack arranged above a dielectric isolation layer. In some embodiments, the nanosheet stack comprises an alternating arrangement of Si layers and SiGe layers. In some embodiments (e.g., as shown in FIG. 3A), the dielectric layer is formed of SiGe with any suitable atomic percentage of Ge. In other embodiments (e.g., as shown in FIG. 3B), the dielectric layer is formed of a BOX layer of a SOI wafer.

At block 1210, a plurality of dummy gates are formed above active channels. At block 1215, one or more contact placeholders are formed between the plurality of dummy gates. In some embodiments, forming the one or more contact placeholders comprises (at block 1220) forming one or more trenches between the plurality of dummy gates, (at block 1225) depositing sacrificial material in the one or more trenches, and (optionally, at block 1230) depositing a semiconductor buffer above the sacrificial material. In some embodiments, each of the dummy gates comprises gate material between gate spacers, and forming the one or more trenches comprises etching through the nanosheet stack between gate spacers of respective dummy gates.

At block 1235, one or more source/drain regions (epitaxy) are formed above the contact placeholders. For example, semiconductor material may be deposited in the one or more trenches to form the one or more source/drain regions. At block 1240, one or more additional front end of line (FEOL) processes are performed, and one or more back end of line (BEOL) processes are performed to the semiconductor device.

At block 1245, a carrier wafer is bonded to a top surface defined by the one or more BEOL processes. At block 1250, the carrier wafer is inverted. At block 1255, the bottom surface of the one or more source/drain regions are exposed (e.g., removing the contact placeholder(s)). At block 1260, self-aligned backside contacts. For example, an electrical contact is formed that extends through one or more layers to the bottom surface. In some embodiments, block 1260 comprises (at block 1265) removing sacrificial material from the contact placeholder, and (at block 1270) filling the trenches with backside contact metallization material.

At block 1275, a buried power rail and a backside power distribution network are formed though the backside contact. In some embodiments, forming the buried power rail comprises (at block 1280) arranging an ILD layer below a bottom surface of the electrical contact, (at block 1285), etching the ILD layer to the bottom surface of the electrical contact, and (at block 1290), filling the openings with metallization materials. The method 1200 ends following completion of block 1290.

Next, FIGS. 13, 14, . . . , 21 illustrate exemplary fabrication sequences that form backside electrical contacts to source and drain regions of a semiconductor device without requiring contact placeholders. It will be understood that the operations, features, benefits, etc. described with respect to the fabrication sequences of FIGS. 1A, 2A, . . . , 6A and FIGS. 1B, 2B, . . . , 6B will be similarly applicable to the fabrication sequence of FIGS. 13, 14, . . . , 21.

FIG. 13 illustrates a silicon layer 1305 above the etch stop layer 1310. In alternate embodiments, the silicon layer 1305 may be replaced by a layer of another semiconductor material. In some embodiments, this can be a SOI wafer, and the etch stop layer 1310 is the BOX layer. In some other embodiments, the etch stop layer can be SiGe (Ge % 20~80%). The assembly 1300 is formed by firstly epitaxially growing the etch stop layer 1310 above the silicon substrate 100, followed by epitaxially growing the silicon layer 1305 above the etch stop layer 1310. In assembly 1400 of FIG. 14, layers of the nanosheet stack 305 may be epitaxially grown above the silicon layer 1305. The nanosheet stack 305 is further patterned so unwanted nanosheet 305 is removed to define nanosheet Fins, and shallow trench isolations are formed between the neighboring nanosheet Fins (not shown in X-cut).

In assembly 1500 of FIG. 15, the plurality of dummy gates 405-1, 405-2, 405-3 are arranged above the silicon layer 1305. A plurality of trenches 1505-1, 1505-2 are formed between the plurality of dummy gates 405-1, 405-2, 405-3 by etching through the nanosheet stack 305 and partly into the silicon layer 1305. Inner spacer is formed by indenting sacrificial SiGe layer followed by dielectric liner fill and isotropic dielectric liner etch back. A semiconductor material used to form source/drain regions 1605-1, 1605-2 is epitaxially grown from the silicon layer 1305. In some embodiments, the semiconductor material of the source/drain regions 1605-1, 1605-2 comprises boron doped SiGe for PFET, and in some embodiments, the semiconductor material of the source/drain regions 1605-1, 1605-2 comprises phosphorous doped Si for NFETs. Because S/D epi are grown from underlying Si surface with (100) surface direction, epi quality is good without massive defects caused by epi merges when epi growth is dominated by growth from sidewall of the exposed nanosheets.

Figure 17:
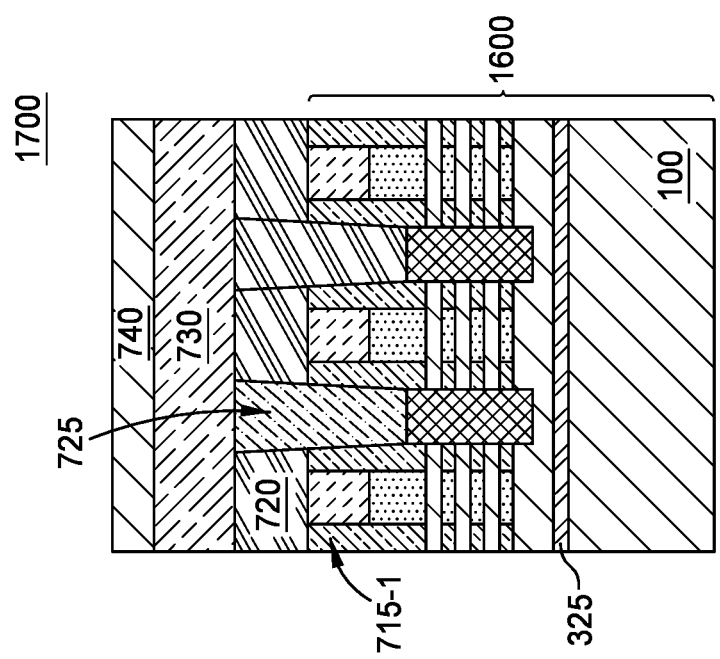
FIG. 17 illustrates performing one or more additional front end of line (FEOL) processes and one or more back end of line (BEOL) processes, and bonding a carrier wafer to a top surface defined by the one or more BEOL processes, according to one or more embodiments.

FIG. 17 illustrates performing one or more additional front end of line (FEOL) processes and one or more back end of line (BEOL) processes, and bonding a carrier wafer to a top surface defined by the one or more BEOL processes. In assembly 1700, the one or more FEOL processes comprise removing the dummy gates 405-1, 405-2, 405-3, forming the gates 715-1, 715-2, 715-3, depositing the ILD layer 720 above the gates 715-1, 715-2, 715-3, and forming an electrical contact 725 through the ILD layer 720 to the source/drain regions 1605-1, 1605-2. The various FEOL processes may be performed consistent with descriptions provided above. In some embodiments, the one or more BEOL processes comprises forming the one or more layers 730 above the ILD layer 720 and bonding the carrier wafer 740 to the one or more layers 730.

Figure 18:
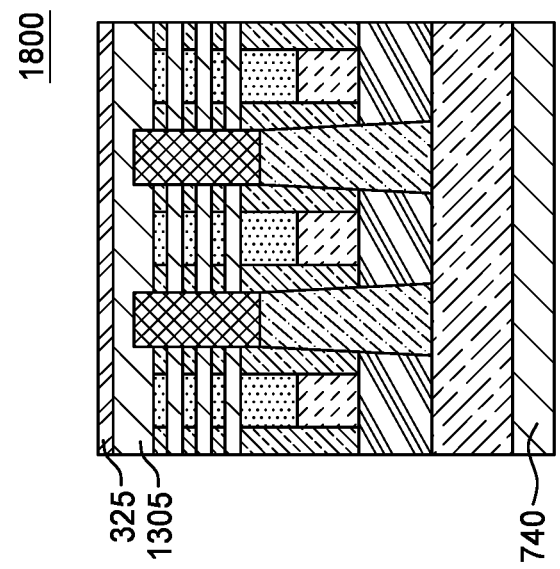
FIG. 18 illustrates removing a semiconductor substrate, according to one or more embodiments.

FIG. 18 illustrates removing the semiconductor substrate 100. In assembly 1800, the assembly 1700 has been inverted using the carrier wafer 740. The semiconductor substrate 100 is removed using any suitable techniques (which represents one example of reducing a thickness of the semiconductor substrate 100), and the etch stop layer 325 is exposed. For example, the semiconductor substrate 100 may be removed using a backside grinding, or CMP process to reduce the thickness to a few hundred nanometers first, followed by a highly selective wet or dry etch process, to remove remaining substrate stopping on etch stop layer 325. Beneficially, use of the etch stop layer 325 helps to improve uniformity when removing the semiconductor substrate 100.

Figure 19:
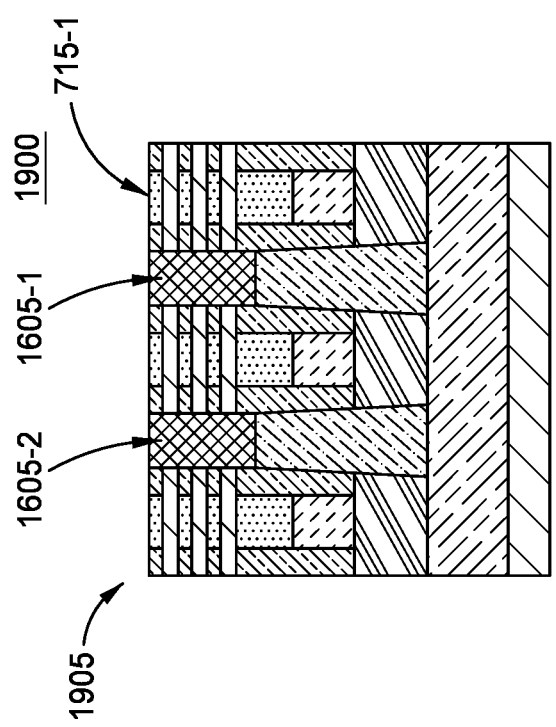
FIG. 19 illustrates removing a dielectric isolation layer and a silicon layer, according to one or more embodiments.

FIG. 19 illustrates removing a etch stop layer 325 and a silicon layer 1305. In some embodiments, the etch stop layer 325 and the silicon layer 1305 are each removed using selective etching. In some embodiments, removing the etch stop layer 325 leaves the silicon layer 1305 with a thickness between 15 and 25 nm. Removing the silicon layer 1305 defines a top surface 1905 of the semiconductor device, at which the gates 715-1, 715-2, 715-3 and the source/drain regions 1605-1, 1605-2 are substantially exposed. In some embodiments, an atomic layer etch is performed to remove the silicon layer 1305, which provides good control within a nanometer range (a tolerance of about ±3 nm may be suitable). The atomic layer etch may be selective to $HfO_2$ included in the gates 715-1, 715-2, 715-3.

Figure 20:
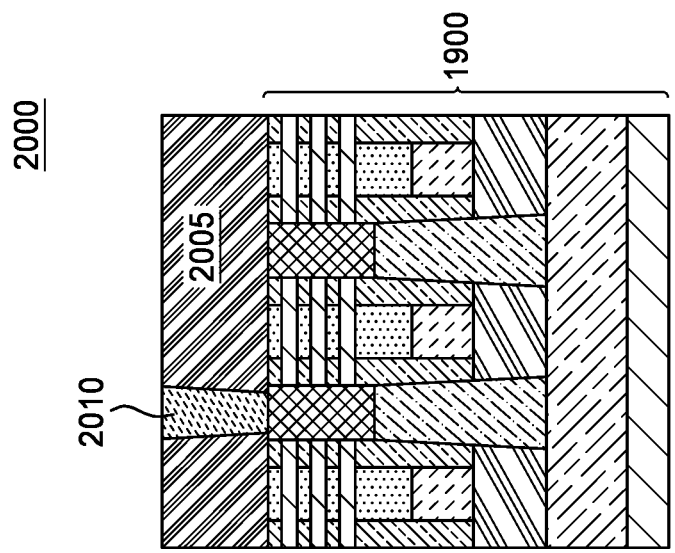
FIG. 20 illustrates forming an electrical contact, according to one or more embodiments.
Figure 21:
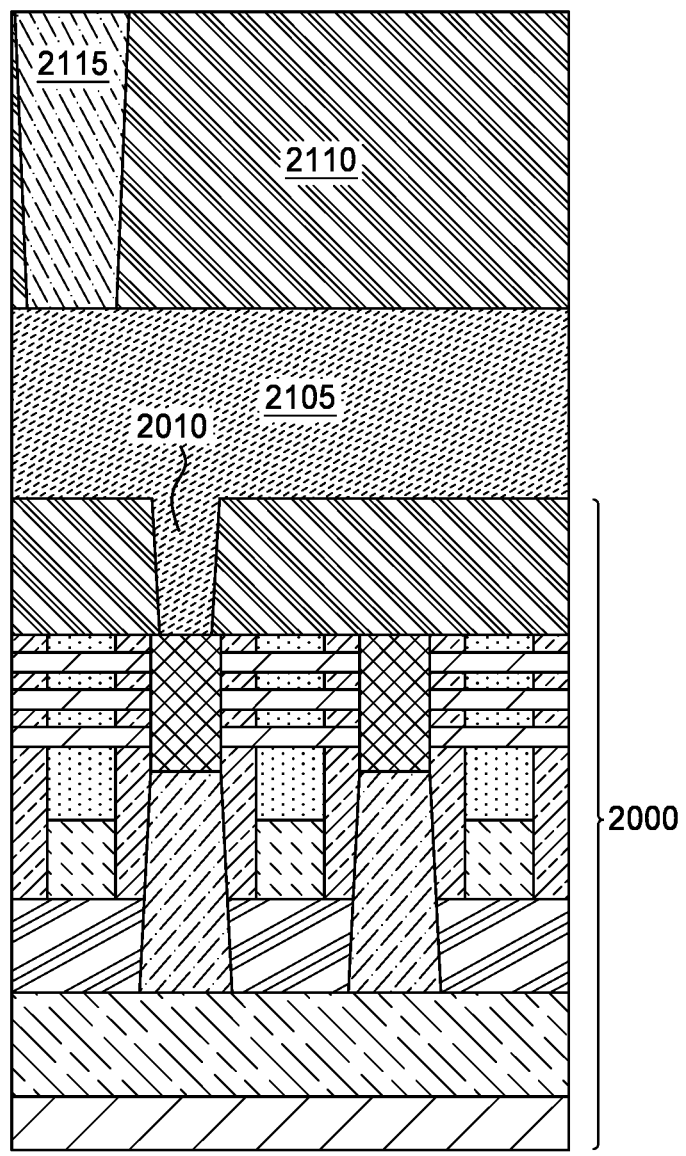
FIG. 21 illustrates forming a buried power rail and a micro through-silicon via, according to one or more embodiments.

In assembly 2000 of FIG. 20, an ILD layer 2005 is arranged on the top surface 1905, and an electrical contact 2010 (e.g., a via) is formed through the ILD layer 2005 to the source/drain region 1605-2. In assembly 2100 of FIG. 21, a buried power rail 2105 is formed above the ILD layer 2005 and contacts the source/drain region 1605-2 through the electrical contact 2010. An ILD layer 2110 is formed above the buried power rail 2105, and a via 2115 is formed through the ILD layer 2110 to the buried power rail 2105 which could further connect the buried power rail to backside power distribution network (not shown).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method comprising:
    arranging a multi-layer stack on a semiconductor substrate, wherein the multi-layer stack comprises a nanosheet stack arranged above a dielectric isolation layer;
    arranging a plurality of dummy gates above the nanosheet stack;
    etching through the nanosheet stack between the plurality of dummy gates to form one or more trenches;
    depositing semiconductor material in the one or more trenches to form a source/drain region, wherein the source/drain region comprises a top surface and a bottom surface positioned between the top surface and the semiconductor substrate;
    removing a portion of the semiconductor substrate such that the bottom surface of the source/drain region is exposed;
    forming an electrical contact that extends through one or more layers to the bottom surface; and
    forming a buried power rail that contacts the bottom surface through the electrical contact.

2. The method of claim 1, wherein the nanosheet stack comprises an alternating arrangement of silicon layers and silicon germanium layers.

3. The method of claim 1, further comprising:
    performing one or more additional front end of line (FEOL) processes and one or more back end of line (BEOL) processes after forming the source/drain region;
    bonding a carrier wafer to a top surface defined by the one or more BEOL processes; and
    inverting the carrier wafer before exposing the bottom surface.

4. The method of claim 1, wherein the one or more layers comprise the semiconductor substrate.

5. The method of claim 1, wherein forming the buried power rail comprises:
    arranging an interlayer dielectric (ILD) layer below a bottom surface of the electrical contact; and
    etching through the ILD layer to the bottom surface of the electrical contact.

6. The method of claim 1, further comprising:
    etching through the dielectric isolation layer and partly through the semiconductor substrate to form the one or more trenches.

7. The method of claim 6, further comprising:
    depositing a sacrificial material in the one or more trenches,
    wherein the semiconductor material is disposed above the sacrificial material.

8. The method of claim 7, wherein exposing the bottom surface comprises:
    selectively etching the sacrificial material.

9. The method of claim 7, further comprising:
    depositing a semiconductor buffer above the sacrificial material,
    wherein the semiconductor material contacts the semiconductor buffer.

10. The method of claim 1,
    wherein the semiconductor substrate is a silicon substrate of a silicon-on-insulator (SOI) wafer, and
    wherein the dielectric isolation layer is a buried oxide (BOX) layer of the SOI wafer,
    the method further comprising:
    etching at least partly through the BOX layer to form the one or more trenches.

11. The method of claim 1, wherein the multi-layer stack further comprises a silicon layer between the nanosheet stack and the dielectric isolation layer, the method further comprising:
    etching partly through the silicon layer to form the one or more trenches.

12. The method of claim 11, wherein exposing the bottom surface comprises:
    removing the semiconductor substrate;
    removing the dielectric isolation layer; and
    removing the silicon layer.

13. A method comprising:
    arranging a nanosheet stack above a silicon substrate;
    arranging a plurality of dummy gates above the nanosheet stack;
    forming one or more contact placeholders between the plurality of dummy gates, wherein forming the one or more contact placeholders comprises etching through the nanosheet stack;
    forming a source/drain region above the one or more contact placeholders, wherein the source/drain region comprises a top surface and a bottom surface positioned between the top surface and the silicon substrate;
    etching at least partly through the silicon substrate to the one or more contact placeholders; and
    selectively etching the one or more contact placeholders to expose the bottom surface of the source/drain region; and
    forming an electrical contact that extends through one or more layers to the bottom surface.

14. The method of claim 13, wherein the one or more contact placeholders comprise a sacrificial dielectric material.

15. The method of claim 13, wherein the one or more contact placeholders comprise a sacrificial silicon germanium material.

16. The method of claim 15, further comprising:
depositing one or more silicon buffers above the one or more contact placeholders,
wherein the source/drain region contacts the one or more silicon buffers.

* * * * *